United States Patent
Nazeeruddin et al.

(10) Patent No.: US 10,665,800 B2
(45) Date of Patent: May 26, 2020

(54) INVERTED SOLAR CELL AND PROCESS FOR PRODUCING THE SAME

(71) Applicants: Ecole Polytechnique Federate de Lausanne (EPFL), Lausanne (CH); Universitat de Valencia, Valencia (ES)

(72) Inventors: Mohammad Khaja Nazeeruddin, Ecublens (CH); Michael Graetzel, St-Sulpice (CH); Hendrik Jan Bolink, Moncada (ES); Olga Malinkiewicz, Wroclaw (PL); Alejandra Soriano Portillo, Burjasot (ES)

(73) Assignees: Ecole Polytechnique Federate de Lausanne (EPFL), Lausanne (CH); Universitat de Valencia, Valencia (ES)

( * ) Notice: Subject to any disclaimer, the term of this patent is extended or adjusted under 35 U.S.C. 154(b) by 48 days.

(21) Appl. No.: 14/917,852

(22) PCT Filed: Sep. 5, 2014

(86) PCT No.: PCT/IB2014/064276
§ 371 (c)(1),
(2) Date: Mar. 9, 2016

(87) PCT Pub. No.: WO2015/036905
PCT Pub. Date: Mar. 19, 2015

(65) Prior Publication Data
US 2016/0226011 A1      Aug. 4, 2016

(30) Foreign Application Priority Data

Sep. 10, 2013 (EP) .................................... 13183813

(51) Int. Cl.
*H01L 51/42* (2006.01)
*H01L 51/44* (2006.01)
*H01L 51/00* (2006.01)

(52) U.S. Cl.
CPC ...... *H01L 51/4213* (2013.01); *H01L 51/4246* (2013.01); *H01L 51/442* (2013.01);
(Continued)

(58) Field of Classification Search
CPC . H01L 51/422; H01L 51/424; H01L 51/4213; H01L 51/4273
(Continued)

(56) References Cited

U.S. PATENT DOCUMENTS 6,344,662 B1 * 2/2002 Dimitrakopoulos ......................... H01L 51/0525
257/40
2005/0263183 A1 * 12/2005 Nishikitani ......... H01L 51/0038
136/263

(Continued)

FOREIGN PATENT DOCUMENTS

JP          2947588 B       9/1999
WO     2011/141706 A2    11/2011

OTHER PUBLICATIONS

Jeng et al, CH3NH3PbI3 Perovskite/Fullerene Planar-Heterojunction Hybrid Solar Cells, Jun. 2013, Adv. Mater. 25, 3727-3732.*

(Continued)

*Primary Examiner* — Andrew J Golden
(74) *Attorney, Agent, or Firm* — Taft Stettinius & Hollister LLP

(57) ABSTRACT

The present invention relates to a method for producing a solid solar cells, including the steps of providing a hole collector layer, applying a conductive layer onto the hole collector layer, applying an electron blocking layer onto the conductive layer, applying a sensitizer layer onto the electron blocking layer, applying a hole blocking layer onto the sensitizer layer, and providing a current collector and/or a (Continued)

metal layer or a conductor. The sensitizer layer including an organic-inorganic perovskite is applied by co-deposition of one or more sublimated divalent or trivalent salts and of one or more sublimated organic ammonium salts to obtain the organic-inorganic perovskite. The invention also relates to solid state solar cells, wherein the charge flow is inverted compared to the charge flow in a solar cell of conventional architecture and/or obtained by the above method.

11 Claims, 4 Drawing Sheets

(52) U.S. Cl.
 CPC ...... *H01L 51/0035* (2013.01); *H01L 51/0037* (2013.01); *H01L 51/0043* (2013.01); *H01L 51/0047* (2013.01); *H01L 51/0077* (2013.01); *H01L 51/447* (2013.01); *Y02E 10/549* (2013.01)

(58) Field of Classification Search
 USPC .................................................. 136/243–265
 See application file for complete search history.

(56) References Cited

U.S. PATENT DOCUMENTS

| | | | |
|---|---|---|---|
| 2008/0319207 A1* | 12/2008 | Laird | H01L 51/0047 549/29 |
| 2011/0079273 A1 | 4/2011 | Arango et al. | |
| 2013/0104987 A1* | 5/2013 | Wang | H01L 51/422 136/263 |
| 2014/0332078 A1* | 11/2014 | Guo | H01L 51/424 136/261 |

OTHER PUBLICATIONS

Heo et al, Efficient inorganic-organic hybrid heterojunction solar cells containing perovskite compound and polymeric hole conductors, May 2013, nature photonics, 7, 486-491.*

Mitzi et al, Thin Film Deposition of Organic-Inorganic Hybrid Materials Using a Single Source Thermal Ablation Technique, 1999, Chem. Mater., 11, 542-544. (Year: 1999).*

International Search Report; European Patent Office; International PCT Application No. PCT/IB2014/064276; dated Nov. 10, 2014; 4 pages.

Written Opinion of the International Searching Authority; European Patent Office; International PCT Application No. PCT/IB2014/064276; dated Nov. 10, 2014; 7 pages.

Michael M. Lee et al.; Efficient Hybrid Solar Cells Based on Meso-Superstructured Organometal Halide Perovskites; Science; Nov. 2, 2012; 6 pages; vol. 338; www.sciencemag.org.

Mingzhen Lui et al.; Efficient Planar Heterojunction Perovskite Solar Cells by Vapour Deposition; Nature; Sep. 19, 2013; 8 pages; vol. 501; Copyright 2013 Macmillan Publishers Limited.

Ola Nilsen et al.; Thin Film Deposition of Lanthanum Manganite Perovskite by the ALE Process; Journal of Materials Chemistry; Apr. 14, 1999; 4 pages; vol. 9.

* cited by examiner

A  B

INVERTED SOLAR CELL AND PROCESS FOR PRODUCING THE SAME

This application is a U.S. national stage filing of International Application No. PCT/IB2014/064276 filed on Sep. 5, 2014, which claims priority to European Application No. 13183813.8 filed on Sep. 10, 2013, the contents of each application incorporated herein by reference in their entirety.

TECHNICAL FIELD

The present invention relates to inverted solar cells and methods for producing the same.

PRIOR ART AND THE PROBLEM UNDERLYING THE INVENTION

The conversion of solar energy to electrical current using thin film third generation photovoltaics (PV) is being widely explored for the last two decades. The sandwich/monolithic-type PV devices, consisting of a mesoporous photoanode with an organic/inorganic light harvester, redox electrolyte/solid-state hole conductor, and counter electrode, have gained significant interest due to the ease of fabrication, flexibility in the selection of materials and cost effective production (Grätzel, M. Acc. Chem. Res. 2009, 42, 1788-1798). Recently, the organometallic halide perovskite based on tin ($CsSnX_3$) or lead ($CH_3NH_3PbX_3$) (Etgar, L. et al.; J. Am. Chem. Soc. 2012, 134, 17396-17399), have been introduced as light harvester to replace traditional metal-organic complex or organic molecules. The lead perovskite shows a power conversion efficiency (PCE) of 6.54% in liquid electrolyte based devices, while 12.3% in solid state devices (Noh, J. H. et al.; Nano Lett. 2013, dx. doi, org/10.1021). Unpublished European patent application EP 12179323.6 disclosed a solid-state solar cell comprising a support layer, a surface-increasing scaffold structure, one or more organic-inorganic perovskite layers provided on the scaffold structure and a counter electrode. In the solar cells reported in this reference, remarkable conversion efficiencies were achieved in absence of organic hole transporting material or a liquid electrolyte, which rendered the latter optional In these solid state devices, the perovskite pigment is usually applied from a solution of two precursors of the perovskite pigment, $PbX_2$ (X=I, Br or Cl) and $CH_3NH_3I$, in a common solvent, i.e. N,N-dimethylformamid (DMF) or y-butyrolactone (GBL). The optimal protocol for the deposition of $CH_3NH_3PbX_3$ on $TiO_2$ is achieved by the spin-coating of the precursor ($CH_3NH_3X$ and $PbX_2$, X=Cl, Br, I) solution on the mesoporous $TiO_2$ film, followed by low temperature annealing step. The annealing process results in a crystalline $CH_3NH_3PbX_3$ (Noh et al cited above). From experience, the morphology of the perovskite crystals formed during this kind of solution processing cannot be well controlled and is one of the reasons for the poor reproducibility of PV cell performance. Unpublished European patent application EP 13166720.6 disclosed an efficient and reproducible method for the application of the light harvester layer of perovskite pigment on the nanopourous layer of the current collector. The two precursors of the organic-inorganic perovskite being in solution are separately applied on the nanoporous layer of the current collector in a two-step deposition, namely a first step for forming a film on the nanoporous layer with the first precursor and a second step for applying a film of the second precursor, to obtain a layer comprising the organic-inorganic perovskite pigment.

These above mentioned solid-state solar cells or devices involve a conventional device architecture, in which the charge flow, namely the electrons and holes flow, is the following: a photoanode, mesoporous photoanode or current collector, collects the electrons. Holes are collected by a counter collector and/or metal layer.

The present invention addresses the disadvantage of the conventional architecture of solid state photovoltaic device regarding the air-stability of the top electrode (metal layer) of such a device, the poor long-term stability and life-time of the device, the efficiency and conductivity (separation of the charges) of such a device. The conventional architecture provides a limited number of possibilities to configure such devices to be optimized. Thus the invention addresses the problems of corrosion and air-stability of the counter electrode and/or metal layer and of the contact between different organic layers to generate better ohmic contact and photon harvesting in order to improve the conductivity without providing heterostructure to facilitate efficient charge carrier generation. Inverting the charges flow in such a device is an efficient way to improve the efficiency as well as stability in PV device and in particular in solid state solar cell.

The invention also addresses the use of perovskite or organic-inorganic perovskite, which does not need to be in solution for their application or deposition to form a layer and to avoid the use of solvents, the step of annealing in the fabrication of the PV cells and the dissolution of the underneath layer of the perovskite layer during the application of this latter.

The invention pursues to provide an efficient solar cell, which can be rapidly prepared in an efficient way, using readily available or low cost materials such as conductive material or hole transporting material, for example, using a short manufacturing procedure based on industrially known manufacturing step, using low temperatures manufacturing process, and using thin layer of electron and/or hole blocking material, keeping the material costs and the material impact on the environment very low.

The present invention addresses the problems depicted above.

SUMMARY OF THE INVENTION

Remarkably, in some aspects, the present inventors have found that a perovskite layer sandwiched between a thin electron blocking layer and/or hole transporting layer that blocks electrons and a thin hole blocking layer and/or electron transporting layer that blocks holes leads to very efficient solar cells.

The present invention provides a method for producing a solid state solar cell, in particular for producing a solid state solar cell with an inverted architecture and comprising an organic-inorganic perovskite film and/or layer. The present inventors also provide a method of deposition of a pigment and/or an organic-inorganic perovskite film in solid state solar cells with inverted architecture.

This method allows the application of the sensitizer layer and/or perovskite layer by co-deposition of sublimated components of the sensitizer layer and/or perovskite components without heating the other layers of the partially assembled solar cell during the fabrication of said solar cell, keeping them at comparatively low-temperatures manufacturing process, which are compatible with the use of flexible substrates for the support layer of solar cell. Said method also allows the deposition of the different components of the sensitizer layer and/or perovskite in one step and without solubilizing the sensitizer layer and/or perovskite allowing the time- and cost-saving production of a sensitizer layer and/or perovskite film in situ without previously mixing the different components for obtaining the sensitizer layer and/or perovskite before its application, without using any solvent to liquefy the components before applying the sensitizer layer and/or perovskite.

The present invention provides a solid state solar cell having an inverted architecture with a perovskite layer applied on an electron blocking layer. Said solar cell having an inverted architecture may further comprise a hole blocking layer applied onto the perovskite layer, this latter being sandwiched between an electron blocking layer and a hole blocking layer.

The present invention also provides a solid solar cell with, the hole collector being on the side of the transparent front contact (namely an inverted architecture with respect to dye sensitized solar cell).

In an aspect, the invention provides a method for producing a solid state solar cell, the method comprising the steps of providing a hole collector layer; applying a conductive layer onto the hole collector layer; applying an electron blocking layer onto the conductive layer; applying a sensitizer layer onto the electron blocking layer by one or more methods selected from physical vapor deposition methods group consisting of deposition by sublimation process, cathodic arc deposition, electron beam physical vapor deposition, thermal evaporation, evaporative deposition, pulse laser deposition, sputter deposition and/or from chemical vapor deposition; applying a hole blocking layer onto the sensitizer layer; and providing a current collector and/or a metal layer or a conductor.

In a further aspect, the invention provides a solid state solar cell comprising a hole collector layer, a conductive layer, an electron blocking layer, a sensitizer layer, a hole blocking layer and a current collector layer, wherein the hole collector layer is coated by the conductive layer; wherein the electron blocking layer is between the conductive layer and the sensitizer layer coated by the hole blocking layer, which is in contact with the current collector layer being a metal or a conductor.

Further aspects and preferred embodiments of the invention are detailed herein below and in the appended claims. Further features and advantages of the invention will become apparent to the skilled person from the description of the preferred embodiments given below.

DETAILED DESCRIPTION OF THE PREFERRED EMBODIMENTS

Figure 1:
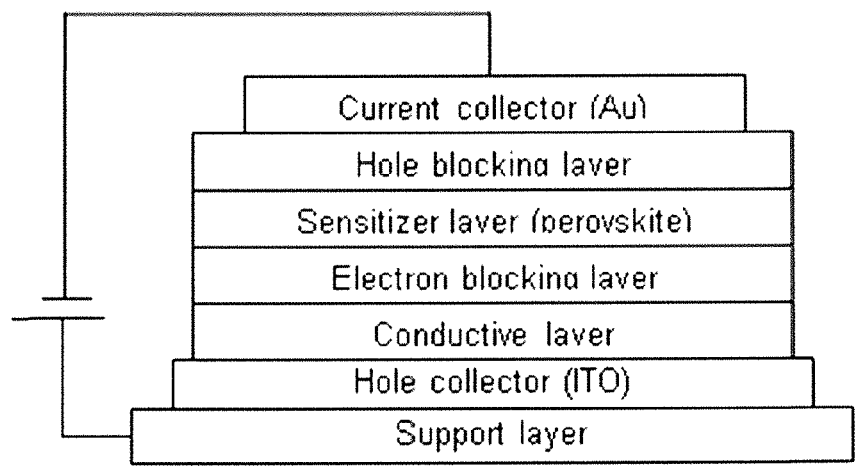
FIG. 1A shows the sketched configuration of the layout of an inverted solar cell of the invention having a sensitizer layer (perovskite) sandwiched between an electron blocking layer (EBL/HTL) and a hole blocking layer (HBL/ETL), the current collector being the top electrode and the hole collector being the transparent electrode on the side exposed to the light.
FIG. 1B shows schemes of the Energy levels of the different materials used respectively for the hole collector, the conductive layer, the electron blocking layer or hole transporting layer (EBL/HTL), the sensitizer (perovskite), the hole blocking layer or electron transporting layer (HBL/ETL) and the current collector of the solar cell (top scheme). In the scheme of bottom left, HBL/ETL blocks electrons due to the difference in LUMO with respect to conduction band of perovskite layer. In the scheme of bottom right, EBL/HTL blocks holes due to difference in HOMO with respect to conduction band of perovskite layer.
Figure 1:
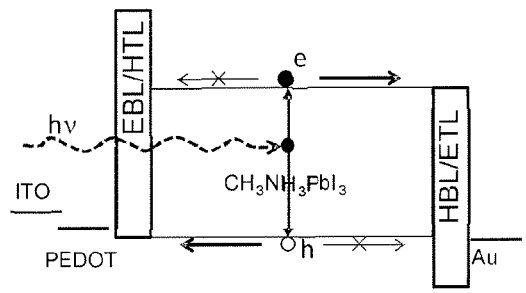
Figure 1:
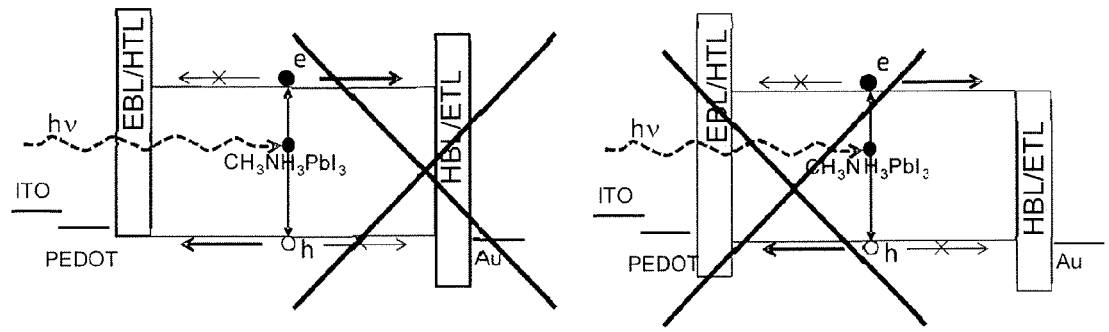

The present invention concerns a new method for producing solid solar cells and solar cells having a non-conventional design and architecture. The invention also concerns new solid solar cells with an inverted architecture, namely having the transparent front on the side of the hole collector.

The method for producing a solid state solar cell comprises the steps of providing a hole collector layer; applying a conductive layer onto the hole collector layer; applying an electron blocking layer onto the conductive layer; applying a sensitizer layer onto the electron blocking layer; and providing a current collector and/or a metal layer or a conductor layer. This latter layer is in electric contact with the sensitizer layer.

The method for producing a solid state solar cell may further comprise a step of applying a hole blocking layer onto the sensitizer layer. In this configuration the current collector and/or the metal layer or the conductor layer is in electric contact with the hole blocking layer. The method of invention comprises the steps of providing a hole collector layer; applying a conductive layer onto the hole collector layer; applying an electron blocking layer onto the conductive layer; applying a sensitizer layer onto the electron blocking layer; applying a hole blocking layer onto the sensitizer layer and providing a current collector and/or a metal layer or a conductor layer onto the hole blocking layer.

For the purpose of the present specification, the expression "in electric contact with" means that electrons or holes can get from one layer to the other layer with which it is in electric contact, at least in one direction. In particular, considering the electron flow in the operating device exposed to electromagnetic radiation, layers through which electrons and/or holes are flowing are considered to be in electric contact. The expression "in electric contact with" does not necessarily mean, and preferably does not mean, that electrons and/or holes can freely move in any direction between the layers.

According to an embodiment, the method of the invention provides a sensitizer layer comprising at least one pigment being selecting from organic, inorganic, organometallic and organic-inorganic pigments or a combination thereof. The sensitizer is preferably a light absorbing compound or material. Preferably, the sensitizer is a pigment, and most preferably the sensitizer is an organic-inorganic pigments.

The sensitizer layer may comprise one or more pigments of the group consisting of organometallic sensitizing compounds (telocyanine derived compounds, porphyrine derived compounds), metal free organic sensitizing compounds (diketopyrrolopyrrole (DPP) based sensitizer), inorganic sensitizing compounds such as quantum dots, $Sb_2S_3$ (Antimonysulfide, for example in the form of thin films), aggregates of organic pigments, nanocomposites, in particular organic-inorganic perovskites, and combinations of the aforementioned. For the purpose of the invention, it is in principle possible to use any type of dyes or sensitizer, including combinations of different types of dyes or different dyes of the same type.

According to an embodiment, the method of the invention provides a sensitizer layer comprising, consisting of or being made of an organic-inorganic perovskite. Said organic-inorganic perovskite is provided under a film of one perovskite pigment or mixed perovskite pigments or perovskite pigments mixed with further dyes or sensitizers as described herein.

According to a further embodiment, the sensitizer layer comprises a further pigment in addition to the organic-inorganic perovskite pigment, said further pigment selected from organic pigment, organometallic pigment or inorganic pigment.

Organometallic sensitizers are disclosed, for example, in EP0613466, EP0758337, EP 0983282, EP 1622178, WO2006/038823, WO2009/107100, WO2010/055471 and WO2011/039715. Exemplary organic dyes are those disclosed in WO2009/098643, EP1990373, WO2007/100033 for example. An organic dye was also used in European patent application no. EP11161954.0. and in PCT/IB2011/054628. Metal free organic sensitizers such as DPP based compounds are disclosed, for example, in PCT/IB2013/056648 and in European patent application no. EP12182817.2.

The term "perovskite", for the purpose of this specification, refers to the "perovskite structure" and not specifically to the perovskite material, CaTiO3. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry $AMX_3$, where "A" and "M" are cations and "X" is an anion. The "A" and "M" cations can have a variety of charges and in the original Perovskite mineral ($CaTiO_3$), the A cation is divalent and the M cation is tetravalent. For the purpose of this invention, the perovskite formulae includes structures having three (3) or four (4) anions, which may be the same or different, and/or one or two (2) organic cations, and/or metal atoms carrying two or three positive charges, in accordance with the formulae presented elsewhere in this specification.

Organic-inorganic perovskites are hybrid materials exhibiting combined properties of organic composites and inorganic crystalline. The inorganic component forms a framework bound by covalent and ionic interactions, which provide high carrier mobility. The organic component helps in the self-assembly process of those materials, it also enables the hybrid materials to be deposited by low-cost technique as other organic materials. Additional important property of the organic component is to tailor the electronic properties of the organic-inorganic material by reducing its dimensionality and the electronic coupling between the inorganic sheets.

According to an embodiment, the method of the invention provides a sensitizer layer having a thickness from 10 nm to 800 nm, 15 nm to 400 nm or 100 nm to 300 nm. The sensitizer layer has a thickness from 20 nm to 350 nm or 60 nm to 350 nm, preferably from 250 nm to 350 nm. Preferably the sensitizer layer comprises or consists of organic-inorganic perovskite has a thickness as defined above, namely from 10 nm to 800 nm, 15 nm to 400 nm, 100 nm to 300 nm, from 20 nm to 350 nm or from 60 nm to 350 nm, preferably from 250 nm to 350 nm.

According to a further embodiment, the method of the invention provides the step of applying the sensitizer layer being performed at a vacuum from $10^{-2}$ to $10^{-10}$ mbar, $10^{-2}$ to $10^{-7}$ mbar, preferably at $10^{-6}$ mbar.

According to another embodiment of the method of the invention, the step of applying the sensitizer layer comprising or consisting of the organic-inorganic perovskite is performed by deposition by sublimation process, wherein the sensitizer layer comprising an organic-inorganic perovskite is obtained by co-deposition of one or more sublimated divalent metal salts or sublimated trivalent metal salts and of one or more sublimated organic ammonium salts. Said deposition may be defined as co-deposition or deposition by sublimation process.

For the purpose of the present specification, the expression "sublimation" means that this is the transition from the solid phase of a material (crystal for example) to the gas phase of said material (or vapor phase) without passing through an intermediate liquid phase at very low pressure, such as high vacuum. The relative expressions "sublimation temperature" corresponds to the term "heat of sublimation" being the temperature at which the phase transition from solid to gas without passing through the liquid phase is performed at a defined pressure. Said temperature depends on the type of the material, substance as well as the pressure in which this phase transition is performed. The relative expression "sublimated" or "sublimed" qualifies or defines the material (e.g. crystal of chemical compounds, of salts, of halide salts, of metallic salts, of organic salts), which has undergone a phase transition from the solid phase to the gas phase without passing through an intermediate liquid phase.

In an embodiment, the step of applying the sensitizer layer comprises heating the one or more divalent or trivalent salts and the ammonium salts up to their respective sublimation temperature to obtain a vapor of each salt, depositing said vapors onto the preceding layer and forming the inorganic-organic perovskite. This step or the process of fabrication the device may be performed without heating said device. Actually, the preceding layer is the electron blocking layer and/or the hole transporting layer of the partially assembled solar cell. Said step of depositing may be performed in a one step process as described above or in a multiple-steps process, wherein each salt forming the organic-inorganic perovskite is sublimated separately and deposited separately in several steps onto the preceding layer for forming the organic-inorganic perovskite layer.

According to an embodiment, said one or more divalent metal salts or said one or more trivalent metal salts, which are heated to their respective sublimation temperature, are selected from salts of formula $MX_2$ or of formula $NX_3$, respectively, wherein: M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$; N is selected from the group of Bi3+ and Sb3+; any X is independently selected from $Cl^-$, $Br^-$, $I^-$, $NCS^-$, $CN^-$, and $NCO^-$. Preferably, said metal salt is $MX_2$.

According to a preferred embodiment, said metal salt is a metal halide. Preferably, in case two or more different metal salts are used, these are different metal halides.

According to an embodiment, said organic ammonium is selected from AX and BX$_2$, A being an organic, monovalent cation selected from primary, secondary, tertiary or quaternary organic ammonium compounds, including N-containing heterorings and ring systems, A having from 1 to 60 carbons and 1 to 20 heteroatoms; and B being an organic, bivalent cation selected from primary, secondary, tertiary or quaternary organic ammonium compounds having from 1 to 60 carbons and 2 to 20 heteroatoms and having two positively charged nitrogen atoms. Preferably, said organic ammonium is selected from AX.

Preferred embodiments for A, B, M, N and X are disclosed elsewhere in this specification, for example with respect to preferred perovskites of the invention.

In a preferred embodiment, the divalent metal salts are of formula MX$_2$ and the trivalent metal salts are of formula NX$_3$, M being a divalent metal cation selected from the group consisting of Cu$^{2+}$, Ni$^{2+}$, Co$^{2+}$, Fe$^{2+}$, Mn$^{2+}$, Cr$^{2+}$, Pd$^{2+}$, Cd$^{2+}$, Ge$^{2+}$, Sn$^{2+}$, Pb$^{2+}$, Eu$^{2+}$, or Yb$^{2+}$, N being selected from the group of Bi$^{3+}$ and Sb$^{3+}$, and X being independently selected from Cl$^-$, Br$^-$, I$^-$, NCS$^-$, CN$^-$, and NCO$^-$; and the organic ammonium salts being selected from AX, AA' X$_2$, and BX$_2$, A and A' being independently selected from organic, monovalent cations selected from primary, secondary, tertiary or quaternary organic ammonium compounds, including N-containing heterorings and ring systems, A and A' having from 1 to 60 carbons and 1 to 20 heteroatoms; and B being an organic, bivalent cation selected from primary, secondary, tertiary or quaternary organic ammonium compounds having from 1 to 60 carbons and 2 to 20 heteroatoms and having two positively charged nitrogen atoms, and, X being independently selected from Cl$^-$, Br$^-$, I$^-$, NCS$^-$, CN$^-$, and NCO$^-$.

When more than one divalent metal salt are applied and/or deposited, the two different salts are sublimated and applied by co-deposition at the same time or in two-steps. For example, in case of deposition from a crystal, the crystal may contain different metal salts, which have been recrystallized together or the deposition may be performed from different crystals from different divalent salts, being sublimated at different temperature according to their respective sublimation temperature. Said different metals salts preferably differ with respect to the anion.

According to an embodiment, the method of the invention comprises the steps of applying the sensitizer layer by co-deposition of two or more sublimated divalent salts selected from MX$^i{}_2$MX$^{ii}{}_2$ and MX$^{iii}{}_2$, wherein X$^i$, X$^{ii}$ and X$^{iii}$i (charge not shown) are each different anions selected from I$^-$, Cl$^-$, Br$^-$, I$^-$, NCS$^-$, CN$^-$, and NCO$^-$, preferably from I$^-$, Cl$^-$, and Br$^-$. A mixed perovskite is obtained if the sublimated metal salt, in the state of vapor, comprising MX$^i{}_2$ and MX$^{ii}{}_2$, or MX$^i{}_2$, MX$^i{}_{12}$ and MX$^{iii}{}_2$, for example, may be co-deposited and/or combined with a sublimated organic ammonium salt, namely in the state of vapor, in accordance with the invention, which may be selected, independently from any one of AX$^i$, AX$^{ii}$ and AX$^{iii}$, under high vacuum, namely from 10$^{-2}$ to 10$^{-10}$ mbar, 10$^{-2}$ to 10$^{-7}$ mbar, preferably at or at least at 10$^{-6}$ mbar.

Preferably, if the sublimated metal salt comprises MX$^1{}_2$ and MX$^{ii}{}_2$, the organic ammonium salt is selected from salts comprising one of the anions contained in the sublimated metal salt, for example from AX$^i$ or AX$^{ii}$.

According to an embodiment, the method of the invention comprises the step of applying the sensitizer layer, wherein said step is performed by co-deposition of two sublimated divalent metal salts, one said salt being MI$_2$ and the further being selected from MCl$_2$ and MBr$_2$ and of the sublimated ammonium organic salt AX, X being I$^-$ and A defined as above or below. Preferably, M is Pb and/or A is CH$_3$NH$_3{}^+$.

According to an embodiment, the method of the invention comprises the step of applying the sensitizer layer, wherein said step is performed by co-deposition of two sublimated divalent metal salts, one said salt being MCl$_2$ and the further being selected from MI$_2$ and MBr$_2$ and of the sublimated ammonium organic salt AX, X being I$^-$ and A defined as above or below. Preferably, M is Pb and/or A is CH$_3$NH$_3{}^+$.

According to a preferred embodiment, the co-deposition of the one or more sublimated organic ammonium salts with the one or more sublimated divalent or trivalent metal salts concerns the co-deposition of one single and/or one structurally defined organic ammonium salt. Preferably, not a mixture of different sublimated organic salts is co-deposited. This is preferably valid irrespective from whether a mixture of different sublimated metal salts or if a single type of sublimated metal salts was co-deposited in the method of the invention.

In a further embodiment, the method of the invention comprises the step of applying the sensitizer layer, wherein said step is performed by co-deposition of sublimated M$^i$X$_2$ with sublimated M$^{ii}$X or sublimated M$^{iii}$X$_3$, and of one or more sublimated ammonium organic salts as defined herein. In this case Mii and Miii represent monovalent or trivalent cations, which would constitute a doping with a monovalent or trivalent metal salt, respectively. In the result, n-type or p-type doped metal salts and eventually perovskites can be obtained. In accordance with the above said two different metal salts may be applied, differing with respect to the metal, but having, for example, identical anions. In this case, metals carrying different charges are preferably applied, resulting in doped perovskite or doped perovskite pigments.

In a preferred embodiment, the step of applying the sensitizer layer is performed by one or more methods selected from physical vapor deposition methods group and/or from chemical vapor deposition. The physical vapor deposition methods group consists of deposition by sublimation process, cathodic arc deposition, electron beam physical vapor deposition, thermal evaporation, evaporative deposition, pulse laser deposition, sputter deposition.

According to another embodiment, the sensitizer layer comprising an organic-inorganic perovskite may be applied in a first step: under the form of a film of the one or more divalent or trivalent metal salt, which is applied and/or deposited by a deposition method selected from deposition from a solution, a dispersion, a colloid or a crystal or a salt, thermal evaporation, deposition by sputtering, electrodeposition, atomic-layer-deposition (ALD), and in a second step, under the application or deposition by anyone of the method as described above of the organic ammonium salt, thereby forming in situ the organic-inorganic perovskite layer. The method of deposition from solution encompasses drop casting, spin-coating, dip-coating, curtain coating, spray-coating, and ink-jet printing methods. The steps of said two-step deposition method may be performed in any order. The sensitizer being an organic-inorganic perovskite may be also applied in one-step process from any one of the methods of deposition from a solution, a dispersion, a colloid, a crystal or a salt, if solution, dispersion, colloid, crystal or salt comprises said organic-inorganic perovskite.

In an embodiment of the method of the invention, the application or deposition of the hole blocking layer is performed by a deposition method from a solution selected from drop casting, spin-coating, dip-coating, curtain coating, spray-coating, and ink-jet printing, meniscus, preferably by meniscus coating. The solution to be applied may comprise one or more hole blocking materials or two or more solutions may be mixed and applied either in a one-step process or in a two or more sequential steps process to form a film onto the sensitizer layer comprising or consisting of the organic-inorganic sensitizer.

In another embodiment of the method of the invention, the step of applying the hole blocking layer is performed by one or more of the method of deposition as defined above, preferably by one or more physical vapor deposition methods, by chemical vapor deposition, by sublimation or deposition of sublimated hole blocking material, by deposition method from a solution (as defined above), meniscus coating.

For the purpose of the invention, the hole blocking material functions as electron transporting material and extracts electrons from the sensitizer layer by preventing the transport of the holes. The hole blocking material is any material having HOMO energy level lower than HOMO energy level of the sensitizer layer or the organic-inorganic perovskite. Thus the hole blocking layer has a LUMO energy level close to the conduction band of the perovskite.

In a further embodiment, the hole blocking layer comprises one or more hole blocking material being selected from [6,6]-phenyl-$C_{61}$-butyric acid methyl ester (PCBM), 1,4,5,8,9,11-hexaazatriphenylene-hexacarbonitrile (HAT-CN), $(C_{60}$-$I_h)$[5,6]fullerene (C60), (C70-D5h)[5,6]fullerene (C70), [6,6]-Phenyl $C_{71}$ butyric acid methyl ester (PC70BM), 2,9-dimethyl-4,7-diphenyl-1,10-phenanthroline (BCP), 1,3,5-tri(phenyl-2-benzimi-dazolyl)-benzene (TPBI), preferably PCBM, HAT-CN, C60, C70, PC70BM, and metal oxide. The metal oxide is an oxide of a metal selected from a group of metal consisting of Ti, Sn, Cs, Fe, Zn, W, Nb, SrTi, Si, Ti, Al, Cr, Sn, Mg, Mn, Zr, Ni, and Cu.

The deposition of a thin hole blocking layer onto the sensitizer layer and/or the organic-inorganic perovskite layer, which is sandwiched between a thin electron blocking layer and said thin hole blocking layer, surprisingly enhances the open-circuit potential of a device, an optoelectronic device, an electrochemical device or a solar cell having such heterojunction, namely a sensitizer layer and/or a perovskite layer sandwiched between a thin electron blocking layer and a thin hole blocking layer.

According to another embodiment, the hole blocking layer has a thickness being ≤10 nm, ≤20 nm, ≤50 nm, preferably ≤10 nm.

In another embodiment, the step of providing the current collector and/or the metal layer or the conductor layer is performed by a method selected from the physical vapor deposition methods group as defined above, preferably by thermal evaporation onto the sensitizer layer or onto the perovskite layer or onto the sensitizer layer comprising a perovskite layer. Said step may be performed under vacuum, at a pressure from $10^{-2}$ to $10^{-10}$ mbar, $10^{-2}$ to $10^{-7}$ mbar, preferably of $2\times10^{-6}$ mbar.

In a further embodiment, the current collector comprises or is a metal layer deposited by thermal evaporation.

In a further embodiment, the step of providing the current collector and/or the metal layer or the conductor layer is performed by a deposition method from a solution as defined above, namely being selected from drop casting, spin-coating, dip-coating, curtain coating, spray-coating, and ink-jet printing, meniscus coating.

According to another embodiment, the current collector and/or a metal layer or the conductor layer has a thickness being ≤30 nm, ≤50 nm, ≤70 nm, ≤90 nm, or ≤110 nm, preferably ≤70 nm. Accordingly, the step of providing the current collector and/or a metal layer or the conductor layer lasts up to that said current collector and/or metal layer or conductor layer has reached the desired thickness defined above.

In an embodiment, the step of applying the conductive layer is performed by a deposition method from one or more solutions of one or more conductive materials, said method selected from drop casting, spin-coating, dip-coating, curtain coating, spray-coating, and ink-jet printing, preferably by spin-coating. The solution may comprise one or more conductive materials or two or more solutions may mixed and applied in a one-step process to form a film onto the hole collector or applied in a process comprising two or more sequential steps.

In another embodiment, the step of applying the conductive layer is performed by a method selected from physical vapor deposition method group and/or from chemical vapor deposition as defined herein.

According to a further embodiment, the conductive material is selected from one or more conductive polymers or one or more hole transporting materials, which may be selected from poly(3,4-ethylenedioxythiophene):poly(styrenesulfonate) (PEDOT:PSS), poly(3,4-ethylenedioxythiophene):poly(styrenesulfonate):grapheme nanocomposite (PEDOT:PSS:graphene), poly(N-vinylcarbazole) (PVK) and sulfonated poly(diphenylamine) (SPDPA), preferably from PEDOT:PSS, PEDOT:PSS:graphene and PVK, more preferably from PEDOT:PSS. Conductive polymers may also be selected from polymers comprising polyaniline, polypyrrole, polythiophene, polybenzene, polyethylenedioxythiophene, polypropylenedioxy-thiophene, polyacetylene, and combinations of two or more of the aforementioned, for example. The conductive polymer of the invention is preferably selected from the above polymer in a watery dispersion.

By "hole transport material", "hole transporting material", "charge transporting material", "organic hole transport material" and "inorganic hole transport material", and the like, is meant any material or composition wherein charges are transported by electron or hole movement (electronic motion) across said material or composition. The "hole transport material" is thus an electrically conductive material. Such hole transport materials, etc., are different from electrolytes. In this latter, charges are transported by diffusion of molecules.

For the purpose of the invention, the conductive material functions as a hole transporting material and as a hole injection material to bring holes extracted from the sensitizer layer to the hole collector of the solid solar cell, in particular of the inverted solid solar cell of the invention, wherein the hole collector is on the side of the transparent electrode or front contact. Accordingly, said conductive material enhances the extraction of holes. The conductive material layer allows to smooth and to uniform the nanoporous semiconductor being the hole collector.

In an embodiment, the step of applying the conductive layer is performed by spin-coating a solution of a conductive polymer selected from poly(3,4-ethylenedioxythiophene):poly(styrenesulfonate) (PEDOT:PSS), poly(3,4-ethylenedioxythiophene):poly(styrenesulfonate):grapheme nanocomposite (PEDOT:PSS:graphene), poly(N-vinylcarbazole) (PVK) and sulfonated poly(diphenylamine) (SPDPA), preferably from PEDOT:PSS, PEDOT:PSS:graphene and PVK, more preferably from PEDOT:PSS.

According to an embodiment, the conductive layer is applied and/or deposited by spin-coating a solution comprising one or more conductive materials or defined as conductive at 1,000 rpm or more, 1,200 rpm or more, 2,000 rpm or more, 3,000 rpm or more, preferably at 1,200 rpm or more. Preferably, the spin-coating takes place for 1 s (second) to 10 minutes, preferably 2 s to 30 s.

According to another embodiment, the conductive layer has a thickness being ≤30 nm, ≤50 nm, ≤70 nm, ≤90 nm, or ≤110 nm, preferably ≤70 nm. Accordingly, the step of applying the conductive layer lasts up to that said conductive layer has reached the desired thickness defined above.

In an embodiment of the method of the invention, the application or deposition of the electron blocking layer is performed by a deposition method from solution selected from drop casting, spin-coating, dip-coating, curtain coating, spray-coating, and ink-jet printing, meniscus, preferably by meniscus coating. The solution may comprise one or more electron blocking material or two or more solutions may mixed and applied in a one-step process to form a film onto the hole collector or applied in a process comprising two or more sequential steps.

In another embodiment, the application or deposition of the electron blocking layer may be performed by a physical vapor deposition method, a chemical vapor deposition method or a deposition by sublimation, namely sublimation.

According to an embodiment, the electron blocking material functions as hole transporting material and extracts holes from the sensitizer layer by preventing the transport of the electron. The electron blocking material is any material having LUMO energy level higher than the sensitizer layer or the organic-inorganic perovskite LUMO energy level. Thus the HOMO energy level of an electron blocking layer is closed to the valence band of the perovskite.

In a further embodiment, the electron blocking layer and/or hole transporting layer comprises one or more electron blocking material being selected from aromatic amine derivatives selected from triphenylamine, carbazole, N,N,(diphenyl)-N',N'di-(alkylphenyl)-4,4'-biphenyldiamine, (pT-PDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD), preferably from polyTPD and/or polyTPD substituted by electron donor groups and/or acceptor groups. Electron blocking material are molecules able to transport holes.

Electron blocking material may be also selected from molecules being able to transport holes such as described or disclosed for example in: "Organic Photoreceptors for Imaging Systems", appendix 3, by Paul M. Borsenberger and David S. Weiss, Marcel Dekker, Inc, NY 1998, in WO 2012/160382 and in WO 2012/160383.

According to another embodiment, the electron blocking layer has a thickness being ≤5, ≤10 nm, ≤20 nm, ≤50 nm, preferably from 4 to 50 nm, from 5 to 20 nm.

It is noted that the term "organic" in expressions "organic hole transport material", "organic hole transport layer", "organic charge transport material" "electron blocking layer" and the like does not exclude the presence of further components. Further components may be selected from (a) one or more dopants, (b) one or more solvents, (c) one or more other additives such as ionic compounds, and (c) combinations of the aforementioned components, for example. In the organic charge transport material, such further components may be present in amounts of 0-30 wt. %, 0-20 wt. %, 0-10 wt. %, most preferably 0-5 wt. %.

In an embodiment, the step of providing a hole collector layer comprises a step of providing a conducting layer being transparent and a step of applying a conducting material onto the conducting layer. Namely the hole collector layer may comprise a conducting layer being transparent and a conducting material. Said conducting layer is selected from conducting glass or conducting plastic. The conducting material is selected from indium doped thin oxide (ITO), fluorine doped tin oxide (FTO), $ZnO\text{—}Ga_2O_3$, $ZnO\text{—}Al_2O_3$, tin-oxide, antimony doped tin oxide (ATO), $SrGeO_3$ and zinc oxide. Accordingly, the hole collector may comprise or may consist of a conducting layer and a conductive material.

In another embodiment, the step of providing a hole collector layer comprises a further step of providing a surface-increasing scaffold structure between the conducting layer and the conducting material layer. Accordingly, the hole collector layer may comprise a conducting layer, a surface-increasing scaffold structure and a conducting material layer.

According to another embodiment, the method of invention comprises a further step of providing a support layer on the external side of the hole collector. Said support layer may be the hole collector or the conducting layer of the hole collector, or comprises the hole collector or is provided before the conducting layer of the hole collector, namely to the external side of the hole collector.

In a further embodiment, the method of invention comprises a further step of providing a support layer on the side of the current collector and/or metal layer or conductor layer, preferably on the top of the current collector and/or metal layer or conductor layer.

The invention also provides a solid state solar cell obtainable by the method of the invention.

The solid state solar cell comprising a hole collector layer, a conductive layer, an electron blocking layer, a sensitizer layer and a current collector layer, wherein the hole collector layer is coated by the conductive layer; wherein the electron blocking layer is between the conductive layer and the sensitizer layer, which is in contact with the current collector layer being a metal or a conductor.

The solid state solar cell of the invention comprises a hole collector layer, a conductive polymer layer, an electron blocking layer, a sensitizer layer and a current collector layer, wherein the hole collector layer comprises a transparent conducting layer and a conducting material, which is coated by the conductive layer, wherein the electron blocking layer is between the conductive layer and the sensitizer layer comprising an organic-inorganic perovskite. In this configuration, the sensitizer layer is in electric contact with the current collector layer, which may be a metal or a conductor.

In a preferred embodiment, the solar cell of the invention further comprise a hole blocking layer. Said hole blocking layer coats the sensitizer layer, which may comprise an organic-inorganic perovskite, and said hole blocking layer is in electric contact with the current collector layer being a metal or conductor. Accordingly, the invention also provides, the invention provides a solid state solar cell comprising a hole collector layer, a conductive polymer layer, an electron blocking layer, a sensitizer layer comprising an organic-inorganic perovskite, a hole blocking layer and a current collector layer, wherein the hole collector layer is coated by the conductive polymer layer; wherein the electron blocking layer is between the conductive polymer layer and the perovskite layer coated by the hole blocking layer, which is in contact with the current collector layer being a metal or a conductor.

In an embodiment, the hole collector layer of the solid state solar cell is on the side exposed to the light.

The hole collector is preferably arranged to collect and conduct the holes generated in the sensitizer layer. Therefore, the current collector is preferably in electric contact with the photocathode.

According to an embodiment, the solar cell of the invention preferably comprises one or more support layers. The support layer preferably provides physical support of the device. Furthermore, the support layer preferably provides a protection with respect to physical damage and thus delimits the solar cell with respect to the outside, for example on at least one of the two sides of the solar cell, the one exposed to the light (support layer) or to the opposite side remaining in the dark (current support layer). According to an embodiment, the solar cell may be constructed by applying the different layers in a sequence of steps, one after the other, onto the support layer. The support layer may thus also serve as a starting support for the fabrication of the solar cell. Support layers may be provided on only one or on both opposing sides of the solar cell.

The support layer, if present, is preferably transparent, so as to let light pass through the solar cell. Of course, if the support layer is provided on the side of the solar cell that is not directly exposed to light to be converted to electrical energy, the support does not necessarily have to be transparent. However, any support layer provided on the side that is designed and/or adapted to be exposed to light for the purpose of energy conversion is preferably transparent. "Transparent" means transparent to at least a part, preferably a major part of the visible light. Preferably, the support layer is substantially transparent to all wavelengths or types of visible light. Furthermore, the support layer may be transparent to non-visible light, such as UV and IR radiation, for example.

In a preferred embodiment of the invention, a support layer is provided, said support layer serving as support as described above as well as the conducting layer of the hole collector. The support layer thus replaces or contains the conducting layer. The support layer is preferably transparent. Examples of support layers are conducting glass or conducting plastic, which are commercially available. For example, the support layer comprises a material selected from indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$ and zinc oxide, coated on a transparent substrate, such as plastic or glass.

In accordance with an embodiment of the method of the invention, when a surface-increasing scaffold structure is provided between the conducting layer and the conducting material of the holes conductor, the surface-increasing scaffold structure is nanostructured and/or nanoporous. The scaffold structure is thus preferably structured on a nanoscale. The structures of said scaffold structure increase the effective surface compared to the surface of the conducting layer.

According to an embodiment, the surface-increasing scaffold structure of the solar cell of the invention comprises, consists essentially of or is made from one selected from the group consisting of a semiconductor material, a conducting material, a non-conducting material and combinations of two or more of the aforementioned.

According to an embodiment, said scaffold structure is made from and/or comprises a metal oxide. For example, the material of the scaffold structure is selected from semiconducting materials, such as Si, TiO$_2$, SnO2, Fe2O3, ZnO, WO3, Nb2O5, CdS, ZnS, PbS, Bi2S3, CdSe, CdTe, SrTiO3, GaP, InP, GaAs, CuInS2, CuInSe2, and combinations thereof, for example. Preferred semiconductor materials are Si, TiO2, SnO2, ZnO, WO3, Nb2O5 and SrTiO3.

However, the material of the scaffold structure does not need to be semiconducting or conducting, but could actually be made from a non-conducting and/or insulating material. As described in PCT/IB2013/056080, for example, the scaffold structure could be made from plastics, for example from plastic nanoparticles, which are in any way assembled on the support and are fixed thereon, for example by heating and/or cross-linking. Polystyrene (PS) spheres of sub-25 micrometer size deposited on a conducting substrate can be cited as an example of a non-conducting scaffold structure.

The invention encompasses solar cells comprising a sensitizer layer and the step of applying a sensitizer layer. The sensitizer is preferably a light-absorbing compound or material. Preferably, the sensitizer is a pigment.

According to a preferred embodiment, the sensitizer layer comprises, consists essentially of or consists of a nanocomposite material or an organic-inorganic pigments. According to a preferred embodiment, the sensitizer layer comprises, consists essentially of or consists of an organic-inorganic perovskite.

According to an embodiment, the organic-inorganic perovskite material that is used and/or obtained in the one or more perovskite layer preferably comprises a perovskite-structure of any one of formulae (I), (II), (III), (IV), (V) and/or (VI) below:

  AA'MX$_4$ (I)

  AMX$_3$ (II)

  AA'N$_{2/3}$X$_4$ (III)

  AN$_{2/3}$X$_3$ (IV)

  BN$_{2/3}$X$_4$ (V)

  BMX$_4$ (VI)

wherein,

A and A' are organic, monovalent cations that are independently selected from primary, secondary, tertiary or quaternary organic ammonium compounds, including N-containing heterorings and ring systems, A and A' having independently from 1 to 60 carbons and 1 to 20 heteroatoms;

B is an organic, bivalent cation selected from primary, secondary, tertiary or quaternary organic ammonium compounds having from 1 to 60 carbons and 2-20 heteroatoms and having two positively charged nitrogen atoms;

M is a divalent metal cation selected from the group consisting of Cu$^{2+}$, Ni$^{2+}$, Co$^{2+}$, Fe$^{2+}$, Mn$^{2+}$, Cr$^{2+}$, Pd$^{2+}$, Cd$^{2+}$, Ge$^{2+}$, Sn$^{2+}$, Pb$^{2+}$, Eu$^{2+}$, or Yb$^{2+}$;

N is selected from the group of Bi$^{3+}$ and Sb$^{3+}$; and, the three or four X are independently selected from Cl$^-$, Br$^-$, I$^-$, NCS$^-$, CN$^-$, and NCO$^-$.

In particular, the three or four X may be the same or different. For example, in AMX$_3$ (formula II) may be expressed as formula (II') below:

  AMX$^i$X$^{ii}$X$^{iii}$ (II')

wherein X$^i$, X$^{ii}$, X$^{iii}$ are independently selected from Cl$^-$, Br$^-$, I$^-$, NCS$^-$, CN$^-$, and NCO$^-$, preferably from halides (Cl$^-$, Br$^-$, I$^-$), and A and M are as defined elsewhere in this specification. X$^i$, X$^{ii}$, X$^{iii}$ may thus be the same or different in this case. The same principle applies to the perovskites of formulae (I) and (III)-(VI) and the more specific embodiments of formulae (VIII) to (XIV) below. In case of AA'MX$_4$ (formula I), for example, formula (I') applies:

AA'MX$^i$X$^{ii}$X$^{iii}$X$^{iv}$ (I')

wherein X$^i$, X$^{ii}$, X$^{iii}$ are independently selected from Cl$^-$, Br$^-$, I$^-$, NCS$^-$, CN$^-$, and NCO$^-$, preferably from halides (Cl$^-$, Br$^-$, I$^-$).

Preferably, if X$^i$, X$^{ii}$, X$^{iii}$ in formulae (II) and (IV) or X$^i$, X$^{ii}$, X$^{iii}$, X$^{iv}$ in formulae (I), (III), (V) or (VI) comprise different anions X, there are not more than two different anions. For example, X$^i$ and X$^{ii}$ being the same with X$^{iii}$ being an anion that is different from X$^i$ and X$^{ii}$.

According to a preferred embodiment, the perovskite material has the structure selected from one or more of formulae (I) to (III), preferably (II) or (II').

According to a preferred embodiment, said organic-inorganic perovskite layer comprises a perovskite-structure of any one of the formulae (VIII) to (XIV):

APbX$_3$ (VIII)

ASnX$_3$ (IX)

ABiX$_4$ (X)

AA'PbX$_4$ (XI)

AA'SnX$_4$ (XII)

BPbX$_4$ (XIII)

BSnX$_4$ (XIV)

wherein A, A', B and X are as defined elsewhere in this specification. Preferably, X is preferably selected from Cl$^-$, Br$^-$ and I$^-$, most preferably X is I$^-$.

According to a preferred embodiment, said organic-inorganic perovskite layer comprises a perovskite-structure of the formulae (VIII) to (XII), more preferably (VIII) and/or (IX) above.

According to an embodiment, A and A', for example in AX and/or in any one of formulae (I) to (IV), and (VIII) to (XII), are monovalent cations selected independently from any one of the compounds of formulae (1) to (8) below:

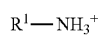  (1)

  (2)

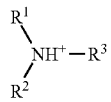  (3)

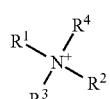  (4)

  (5)

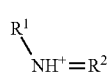  (6)

  (7)

  (8)

wherein, any one of R$^1$, R$^2$, R$^3$ and R$^4$ is independently selected from C1-C15 organic substituents comprising from 0 to 15 heteroatoms.

According to an embodiment of said C1-C15 organic substituent any one, several or all hydrogens in said substituent may be replaced by halogen and said organic substituent may comprise up to fifteen (15) N, S or O heteroatoms, and wherein, in any one of the compounds (2) to (8), the two or more of substituents present (R$^1$, R$^2$, R$^3$ and R$^4$, as applicable) may be covalently connected to each other to form a substituted or unsubstituted ring or ring system. Preferably, in a chain of atoms of said C1-C15 organic substituent, any heteroatom is connected to at least one carbon atom. Preferably, neighboring heteroatoms are absent and/or heteroatom-heteroatom bonds are absent in said C1-C15 organic substituent comprising from 0 to 15 heteroatoms.

According to an embodiment any one of R$^1$, R$^2$, R$^3$ and R$^4$ is independently selected from C1 to C15 aliphatic and C4 to C15 aromatic or heteroaromatic substituents, wherein any one, several or all hydrogens in said substituent may be replaced by halogen and wherein, in any one of the compounds (2) to (8), the two or more of the substituents present may be covalently connected to each other to form a substituted or unsubstituted ring or ring system.

According to an embodiment, B is a bivalent cation selected from any one of the compounds of formulae (9) and (10) below:

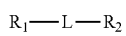  (9)

  (10)

wherein, in the compound of formula (9), L is an organic linker structure having 1 to 10 carbons and 0 to 5 heteroatoms selected from N, S, and/or O, wherein any one, several or all hydrogens in said L may be replaced by halogen;

wherein any one of R$_1$ and R$_2$ is independently selected from any one of the substituents (20) to (25) below:

  (20)

  (21)

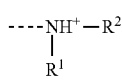  (22)

-continued

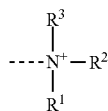
(23)

(24)

(25)

wherein the dotted line in the substituents (20) to (25) represents the bond by which said substituent is connected to the linker structure L;

wherein $R^1$, $R^2$, and $R^3$ are independently as defined above with respect to the compounds of formulae (1) to (8);

wherein $R_1$ and $R_2$, if they are both different from substituent (20), may be covalently connected to each other by way of their substituents $R^1$, $R^2$, and/or $R^3$, as applicable, and wherein any one of $R^1$, $R^2$, and $R^3$, if present, may be covalently connected to L or the ring structure of compound (10), independently from whether said substituent is present on $R_1$ or $R_2$;

and wherein, in the compound of formula (10), the circle containing said two positively charged nitrogen atoms represents a substituted or unsubstituted aromatic ring or ring system comprising 4 to 15 carbon atoms and 2 to 7 heteroatoms, wherein said nitrogen atoms are ring heteroatoms of said ring or ring system, and wherein the remaining of said heteroatoms may be selected independently from N, O and S and wherein $R^5$ and $R^6$ are independently selected from H and from substituents as $R^1$ to $R^4$. Halogens substituting hydrogens totally or partially may also be present in addition to and/or independently of said 2 to 7 heteroatoms.

Preferably, if the number of carbons is in L is impair, the number of heteroatoms is smaller than the number of carbons. Preferably, in the ring structure of formula (10), the number of ring heteroatoms is smaller than the number of carbon atoms.

According to an embodiment, L is an aliphatic, aromatic or heteroaromatic linker structure having from 1 to 10 carbons.

Preferably, the dotted line in substituents (20) to (25) represents a carbon-nitrogen bond, connecting the nitrogen atom shown in the substituent to a carbon atom of the linker.

According to an embodiment, in the compound of formula (9), L is an organic linker structure having 1 to 8 carbons and from 0 to 4 N, S and/or O heteroatoms, wherein any one, several or all hydrogens in said L may be replaced by halogen. Preferably, L is an aliphatic, aromatic or heteroaromatic linker structure having 1 to 8 carbons, wherein any one, several or all hydrogens in said L may be replaced by halogen.

According to an embodiment, in the compound of formula (9), L is an organic linker structure having 1 to 6 carbons and from 0 to 3 N, S and/or O heteroatoms, wherein any one, several or all hydrogens in said L may be replaced by halogen. Preferably, L is an aliphatic, aromatic or heteroaromatic linker structure having 1 to 6 carbons, wherein any one, several or all hydrogens in said L may be replaced by halogen.

According to an embodiment, in the compound of formula (9), said linker L is free of any O or S heteroatoms. According to an embodiment, L is free of N, O and/or S heteroatoms.

According to an embodiment, in the compound of formula (10), the circle containing said two positively charged nitrogen atoms represents a substituted or unsubstituted aromatic ring or ring system comprising 4 to 10 carbon atoms and 2 to 5 heteroatoms (including said two ring N-atoms).

According to an embodiment, said ring or ring system in the compound of formula (10) is free of any O or S heteroatoms. According to an embodiment, said ring or ring system in the compound of formula (10) is free of any further N, O and/or S heteroatoms, besides said two N-ring atoms. This does not preclude the possibility of hydrogens being substituted by halogens.

As the skilled person will understand, if an aromatic linker, compound, substituent or ring comprises 4 carbons, it comprises at least 1 ring heteroatom, so as to provide an aromatic moiety.

According to an embodiment, any one of $R^1$, $R^2$, $R^3$ and $R^4$ is independently selected from C1 to C8 organic substituents comprising, from 0 to 4 N, S and/or O heteroatom, wherein, independently of said N, S or O heteroatoms, any one, several or all hydrogens in said substituent may be replaced by halogen, and wherein two or more of substituents present on the same cation may be covalently connected to each other to form a substituted or unsubstituted ring or ring system. Preferably, any one of $R^1$, $R^2$, $R^3$ and $R^4$ is independently selected from C1 to C8 aliphatic, C4 to C8 heteroaromatic and C6 to C8 aromatic substituents, wherein said heteroaromatic and aromatic substituents may be further substituted.

According to an embodiment, any one of $R^1$, $R^2$, $R^3$ and $R^4$ is independently selected from C1 to C6 organic substituents comprising, from 0 to 3 N, S and/or O heteroatom, wherein, independently of said N, S or O heteroatoms, any one, several or all hydrogens in said substituent may be replaced by halogen, and wherein two or more of substituents present on the same cation may be covalently connected to each other to form a substituted or unsubstituted ring or ring system. Preferably, any one of $R^1$, $R^2$, $R^3$ and $R^4$ is independently selected from C1 to C6 aliphatic, C4 to C6 heteroaromatic and C6 to C6 aromatic substituents, wherein said heteroaromatic and aromatic substituents may be further substituted.

According to an embodiment, any one of $R^1$, $R^2$, $R^3$ and $R^4$ is independently selected from C1 to C4, preferably C1 to C3 and most preferably C1 to C2 aliphatic substituents wherein any one, several or all hydrogens in said substituent may be replaced by halogen and wherein two or more of substituents present on the same cation may be covalently connected to each other to form a substituted or unsubstituted ring or ring system.

According to an embodiment, any one of $R^1$, $R^2$, $R^3$ and $R^4$ is independently selected from C1 to C10 alkyl, C2 to C10 alkenyl, C2 to C10 alkynyl, C4 to C10 heteroaryl and C6 to C10 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C8 alkyl, C2 to C8 alkenyl, C2 to C8 alkynyl, C4 to C8 heteroaryl and C6 to C8 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C6 alkyl, C2 to C6 alkenyl, C2 to C6 alkynyl, C4 to C6 heteroaryl and C6 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C4 alkyl, C2 to C4 alkenyl and C2 to C4 alkynyl, wherein said alkyl, alkenyl and alkynyl, if they comprise 3 or more carbons, may be linear, branched or cyclic, and wherein several or all hydrogens in $R^1$-$R^4$ may be replaced by halogen.

According to an embodiment, any one of $R^1$, $R^2$, $R^3$ and $R^4$ is independently selected from C1 to C3, preferably C1 to C2 alkyl, C2 to C3, preferably C2 alkenyl and C2 to C3, preferably C2 alkynyl, wherein said alkyl, alkenyl and alkynyl, if they comprise 3 or more carbons, may be linear, branched or cyclic, and wherein several or all hydrogens in $R^1$-$R^4$ may be replaced by halogen.

According to an embodiment, any one of $R^1$, $R^2$, $R^3$ and $R^4$ is independently selected from C1 to C4, more preferably C1 to C3 and even more preferably C1 to C2 alkyl. Most preferably, any one of $R^1$, $R^2$, $R^3$ and $R^4$ are methyl. Again, said alkyl may be completely or partially halogenated.

According to an embodiment, A, A' and B are monovalent (A, A') and bivalent (B) cations, respectively, selected from substituted and unsubstituted C5 to C6 rings comprising one, two or more nitrogen heteroatoms, wherein one (for A and A') or two (for B) of said nitrogen atoms is/are positively charged. Substituents of such rings may be selected from halogen and from C1 to C4 alkyls, C2 to C4 alkenyls and C2 to C4 alkynyls as defined above, preferably from C1 to C3 alkyls, C3 alkenyls and C3 alkynyls as defined above. Said ring may comprise further heteroatoms, which may be selected from O, N and S. Bivalent organic cations B comprising two positively charged ring N-atoms are exemplified, for example, by the compound of formula (10) above. Such rings may be aromatic or aliphatic, for example.

A, A' and B may also comprise a ring system comprising two or more rings, at least one of which being from substituted and unsubstituted C5 to C6 ring as defined as above. The elliptically drawn circle in the compound of formulae (10) may also represent a ring system comprising, for example, two or more rings, but preferably two rings. Also if A and/or A' comprises two rings, further ring heteroatoms may be present, which are preferably not charged, for example.

According to an embodiment, however, the organic cations A, A' and B comprise one (for A, A'), two (for B) or more nitrogen atom(s) but are free of any O or S or any other heteroatom, with the exception of halogens, which may substitute one or more hydrogen atoms in cation A and/or B.

A and A' preferably comprise one positively charged nitrogen atom. B preferably comprises two positively charged nitrogen atoms.

A, A' and B may be selected from the exemplary rings or ring systems of formulae (30) and (31) (for A) and from (32) to (34) (for B) below:

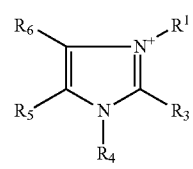

(30)

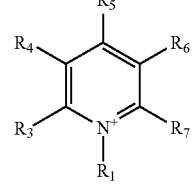

(31)

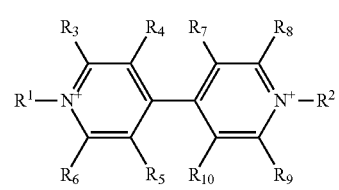

(32)

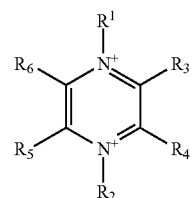

(33)

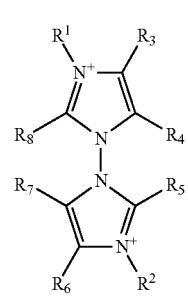

(34)

in which $R^1$ and $R^2$ are, independently, as defined above, and $R_3$, $R_4$, $R_5$, $R_6$, $R_7$, $R_8$, $R_9$ and $R_{10}$ are independently selected from H, halogen and substituents as defined above for $R^1$ to $R^4$. Preferably, $R_3$-$R_{10}$ are selected from H and halogen, most preferably H.

In the organic cations A, A' and B, hydrogens may be substituted by halogens, such as F, Cl, I, and Br, preferably F or Cl. Such a substitution is expected to reduce the hygroscopic properties of the perovskite layer or layers and may thus provide a useful option for the purpose of the present specification.

According to a preferred embodiment, A and A' are independently selected from organic cations of formula (1). Preferably, $R^1$ in the cation of formula (1) is selected from C1 to C8 organic substituents comprising, from 0 to 4 N, S and/or O heteroatom. More preferably, $R^1$ is selected from C1 to C4, preferably C1 to C3 and most preferably C1 to C2 aliphatic substituents.

According to a preferred embodiment, the metal M is selected from $Sn^{2+}$ and $Pb^{2+}$, preferably $Pb^{2+}$. According to a preferred embodiment, N is $Sb^{3+}$.

According to a preferred embodiment, the three or four X are independently selected from $Cl^-$, $Br^-$, and $I^-$.

According to a preferred embodiment, the organic-inorganic perovskite material has the formula of formulae (XV) to (XIX) below:

$$AMI_3 \quad (XV)$$

$$AMI_2Br \quad (XVI)$$

$$AMI_2Cl \quad (XVII)$$

$$AMBr_3 \quad (XVII)$$

$$AMCl_3 \quad (XIX)$$

wherein A and M are as defined elsewhere in this specification, including the preferred embodiments of A and M, such as those defined below. Preferably, M is selected from $Sn^{2+}$ and $Pb^{2+}$. Preferably, A is selected from organic cations of formula (1). Preferably, $R^1$ in the cation of formula (1) is selected from C1 to C8 organic substituents comprising, from 0 to 4 N, S and/or O heteroatom. More preferably, $R^1$ is selected from C1 to C4, preferably C1 to C3 and most preferably C1 to C2 aliphatic substituents.

According to a preferred embodiment, the organic-inorganic perovskite is a compound of formula (VII) ($AMX^iX^{ii}X^{iii}$), wherein A is a monovalent cation of formula (1) as defined above, M is as defined elsewhere in this specification, and $X^i$, $X^{ii}$, $X^{iii}$ are independently selected from $Cl^-$, $Br^-$, $I^-$. Preferably, $R^1$ in the cation of formula (1) is selected from C1 to C4, preferably C1 to C3 and most preferably C1 to C2 aliphatic substituents.

According to a preferred embodiment, the organic-inorganic perovskite is a compound of formula (VII) ($AMX^iX^{ii}X^{iii}$), wherein A is a monovalent cation of formula (1) as defined above, M is $Sn^{2+}$ or $Pb^{2+}$, and $X^i$, $X^{ii}$, $X^{iii}$ are independently selected from $Cl^-$, $Br^-$, $I^-$. Preferably, $R^1$ in the cation of formula (1) is selected from C1 to C4, preferably C1 to C3 and most preferably C1 to C2 aliphatic substituents. Preferably, $X^i$-$X^{iii}$ are identical.

In the methods of the invention, if the sensitizer layer comprises an organic-inorganic perovskite layer or consists of a perovskite layer or contains organic-inorganic perovskite pigments, the perovskite layer or pigments may be applied in direct contact with and/or on the electron blocking layer.

According to another embodiment of the solar cell of the invention, the current collector of the solar cell of the invention is on the dark side. The current collector is preferably arranged to collect and conduct the electron generated in the perovskite layer. The current collector faces the sensitizer layer towards the inside of the solar cell. The current collector is the outmost layer and thus the one of the outer surfaces of the cell. It is also possible that a support layer is present on one side of the current collector.

In a further embodiment, the current collector comprises or consists of or is a metal or a conductor, which is in direct contact with the preceding layer being the sensitizer layer or the hole blocking layer, if said hole blocking layer is present.

In a further embodiment, the current collector comprises or consists of or is a conductor, which may be in direct contact with the sensitizer layer and/or not separated by any further layer or medium from said sensitizer layer.

According to another embodiment, the current collector comprises a catalytically active material, suitable to provide electrons and/or fill holes towards the inside of the device. The current collector may comprise a metal or a conductor or may be a metal layer or a conductor layer. The current collector may comprise one or more materials being metals selected from Pt, Au, Ni, Cu, Ag, In, Ru, Pd, Rh, Ir, Os, C or conductors selected from carbon nanotubes, graphene and grapheme oxides, conductive polymer and a combination of two or more of the aforementioned. Conductive polymers may be selected from polymers comprising polyaniline, polypyrrole, polythiophene, polybenzene, polyethylenedioxythiophene, polypropylenedioxythiophene, polyacetylene, and combinations of two or more of the aforementioned. Preferably the current collector comprises a metal selected from Pt, Au, Ni, Cu, Ag, In, Ru, Pd, Rh, Ir, Os, preferably Au.

The current collector may comprise a conductor being transparent material selected from indium doped tin oxide (ITO), fluorine doped tin oxide (FTO), $ZnO$—$Ga_2O_3$, $ZnO$—$Al_2O_3$, tin oxide, antimony doped tin oxide (ATO), $SrGeO_3$ and zinc oxide.

The current collector is connected to the external circuit. With respect to the first side of the device, a conductive support such as conductive glass or plastic may be electrically connected to the counter electrode on the second side.

The solar cell of the invention is preferably a solid state solar cell.

The solar cell of the invention may be a dye-sensitized solar cell (DSC), for example sensitized by a nanocomposite sensitizer, such as said organic-inorganic perovskite.

According to an embodiment, solar cell according to an embodiment of the invention exhibits a power conversion efficiency (PCE) of 4%, preferably 5%, more preferably 6%, and most preferably 7%, measured in standard air mass 1.5 global (AM1.5G) sunlight conditions, corresponding to a solar zenith angle of 48.2°, a solar light intensity of 100 mW $cm^2$ and a cell temperature of 25° C.

The present invention will now be illustrated by way of examples. These examples do not limit the scope of this invention, which is defined by the appended claims.

EXAMPLES

Example 1

Fabrication of a Solid Solar of the Invention Having a Sensitizer Sandwiched Between an Electron Blocking Layer and an Hole Blocking Layer Photolithographically patterned ITO covered glass substrates were purchased from NaranjoSubstrates. Aqueous dispersions of poly(3,4-ethylenedioxythiophene) doped with poly(styrenesulfonate) (PEDOT:PSS, CLEVIOS P VP Al 4083) were obtained from Heraeus Holding GmbH and used as received. poly[N,N'-bis(4-butylphenyl)-N,N'-bis(phenyl) benzidine] (poly-TPD) was purchased from ADS Dyesource. $PbI_2$ was purchased from Aldrich and used as is, $CH_3NH_3I$ was prepared similar to a previously published method, in brief: $CH_3NH_3I$, was synthesized by reacting 21.6 ml methylamine (40% wt in water, Aldrich) and 30 ml hydroiodic acid (57 wt % in water, Aldrich) in a 250 ml round-bottomed flask at 0° C. for 2 h with stirring. The white precipitate was recovered by evaporation at 50° C. for 1 h. The product, methylammonium iodide ($CH_3NH_3I$), was dissolved in ethanol, filtered and recrystallized from diethyl ether, and dried at 60° C. in a vacuum oven for 24 h.

Devices were prepared on cleaned ITO substrates, by spin-coating a thin layer of PEDOT:PSS from the commercial aqueous dispersion (1200 rpm 30 sec result in 70 nm thickness). On top of this layer a thin film (≤10 nm) of polyTPD functioning as the electron blocking layer was deposited from a chlorobenzene solution (10 mg·$ml^{-1}$) using a meniscus coater and a coating speed of 2.5 mm/s. Than the substrates were transferred to a vacuum chamber integrated into an inert glovebox (MBraun, <0.1 ppm $O_2$ and <0.1 ppm $H_2O$) and evacuated to a pressure of $1\times10^{-6}$ mbar. Two quartz crucibles were filed with $CH_3NH_3I$ and PbI2 which were heated to 70 and 250° C., respectively. The film thickness was controlled by the $PbI_2$ evaporation at a rate of evaporation of 0.5 Angstrom per second. The perovskite layer thickness is of 350 nm. The PCBM layer functioning as the hole blocking layer was deposited as a thin layer ($\leq 10$ nm) using a chlorobenzene solution of 10 mg·ml$^{-1}$ in ambient conditions using a meniscus coater and a coating speed of 2.5 mm/s. The device was completed by the thermal evaporation of the top metal (Au) electrode under a base pressure of $2\times10^{-6}$ mbar to a thickness of 100 nm. The solar cells (active area of 0.09 and 0.98 mm$^2$) were than encapsulated with a glass cover using a UV curable epoxy sealant.

Example 2

Photovoltaic Properties and Characteristics of the Solid Solar of Example 1

Current-voltage characteristics were recorded by applying an external potential bias to the cell while recording the generated photocurrent with a digital source meter (Keithley Model 2400). The light source was a 450-W xenon lamp (Oriel) equipped with a Schott K113 Tempax sunlight filter (Praezisions Glas & Optik GmbH) to match the emission spectrum of the lamp to the AM1.5G standard. A black mask of 5×5 cm$^2$ was used in the photovoltaic studies. Before each measurement, the exact light intensity was determined using a calibrated Si reference diode equipped with an infrared cut-off filter (KG-3, Schott). Incident photon-to-current conversion efficiency (IPCE) measurements were determined using a 300 W xenon light source (ILC Technology, USA). A Gemini-180 double monochromator Jobin Yvon Ltd. (UK) was used to select and increment the wavelength of the radiation impinging on the cells. The monochromatic incident light was passed through a chopper running at 1 Hz frequency, and the on/off ratio was measured by an operational amplifier. IPCE spectra were recorded as functions of wavelength under a constant white light bias of approximately 5 mW cm$^{-2}$ supplied by an array of white light-emitting diodes. The excitation beam coming from a 300-W xenon lamp (ILC Technology) was focused through a Gemini-180 double monochromator (Jobin Yvon Ltd) and chopped at approximately 2 Hz. The signal was record-ed using a Model SR830 DSP Lock-In Amplifier (Stanford Research Systems). Said measured characteristics and the estimated power conversion efficiency (PCE) are reported in Table 1 below.

TABLE 1

Photovoltaic characteristics of three solar cells of the invention as described in Example 1

|  | $V_{OC}$ [mV] | $J_{SC}$ [mA/cm$^2$] | FF [%] | PCE [%] |
| --- | --- | --- | --- | --- |
| Solar cell 1 | 1049 | 17.04 | 67 | 11.97 |
| Solar cell 2 | 1045 | 15.16 | 68 | 10.77 |
| Solar cell 3 | 1054 | 16.96 | 65 | 11.61 |

Figure 3:
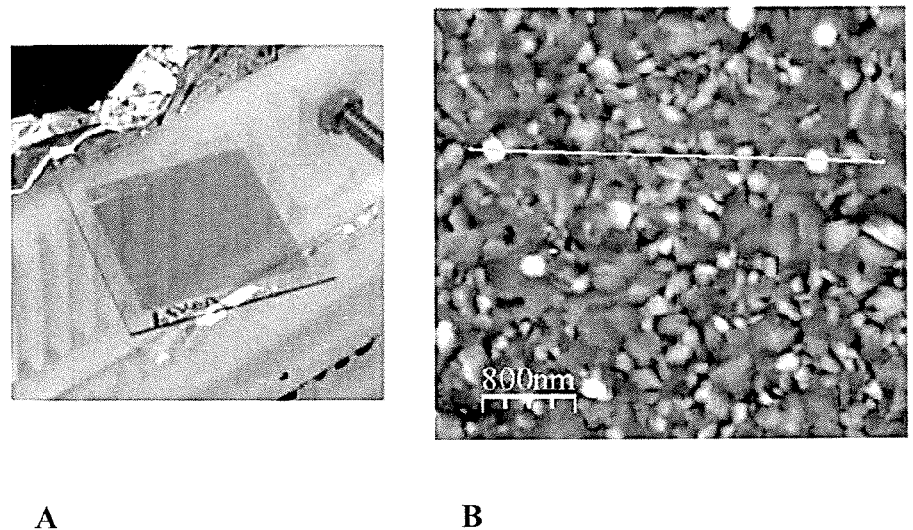
FIG. 3A shows a photograph of an organic-inorganic perovskite layer (60 nm) obtained through the method of the invention, namely co-deposition of the sublimated component salts of the perovskite ($CH_3NH_3PbI_3$)
FIG. 3B shows an AFM (Atomic Force Microscopy) image of the same.
Figure 4A:
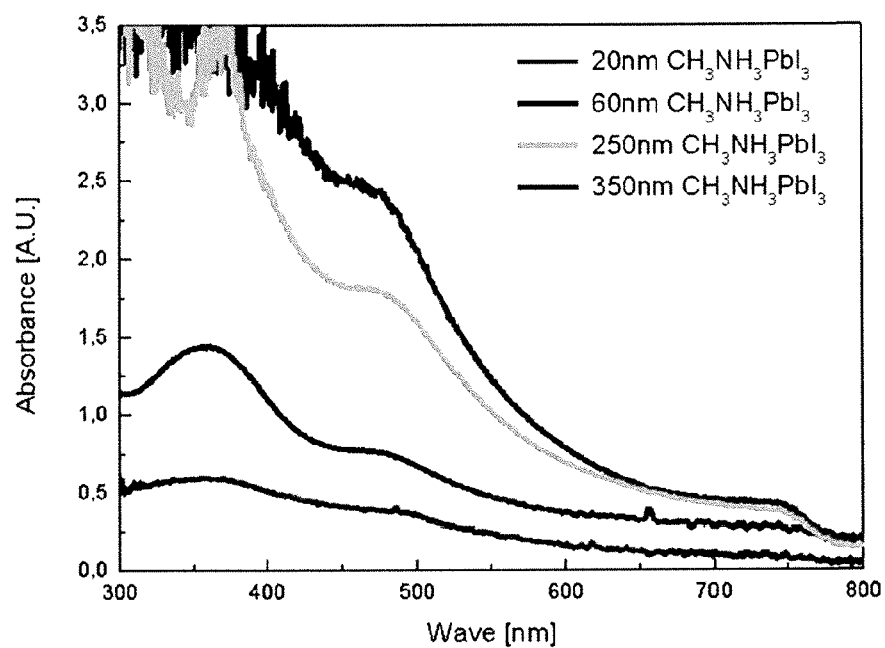
FIG. 4A shows absorption spectra of perovskite ($CH_3NH_3PbI_3$) layer having different thickness from the bottom curve to the top curve: 20 nm, 60 nm, 250 nm, 350 nm.

The roughness of the $CH_3NH_3PbI_3$ film was evaluated using Atomic Force Microscopy (AFM) and an image of a typical scan is depicted in FIG. 3B, demonstrating a smooth film with an rms roughness of 5 nm. The photograph of a 60 nm thick film is shown in FIG. 3A. The absorbance of the $CH_3NH_3PbI_3$ film co-deposited by sublimation is increases with increasing layer thickness (FIGS. 4A and 4C). The absorption extends over the complete visible spectrum up to 800 nm, with a local maximum around 500 nm.

Figure 2:
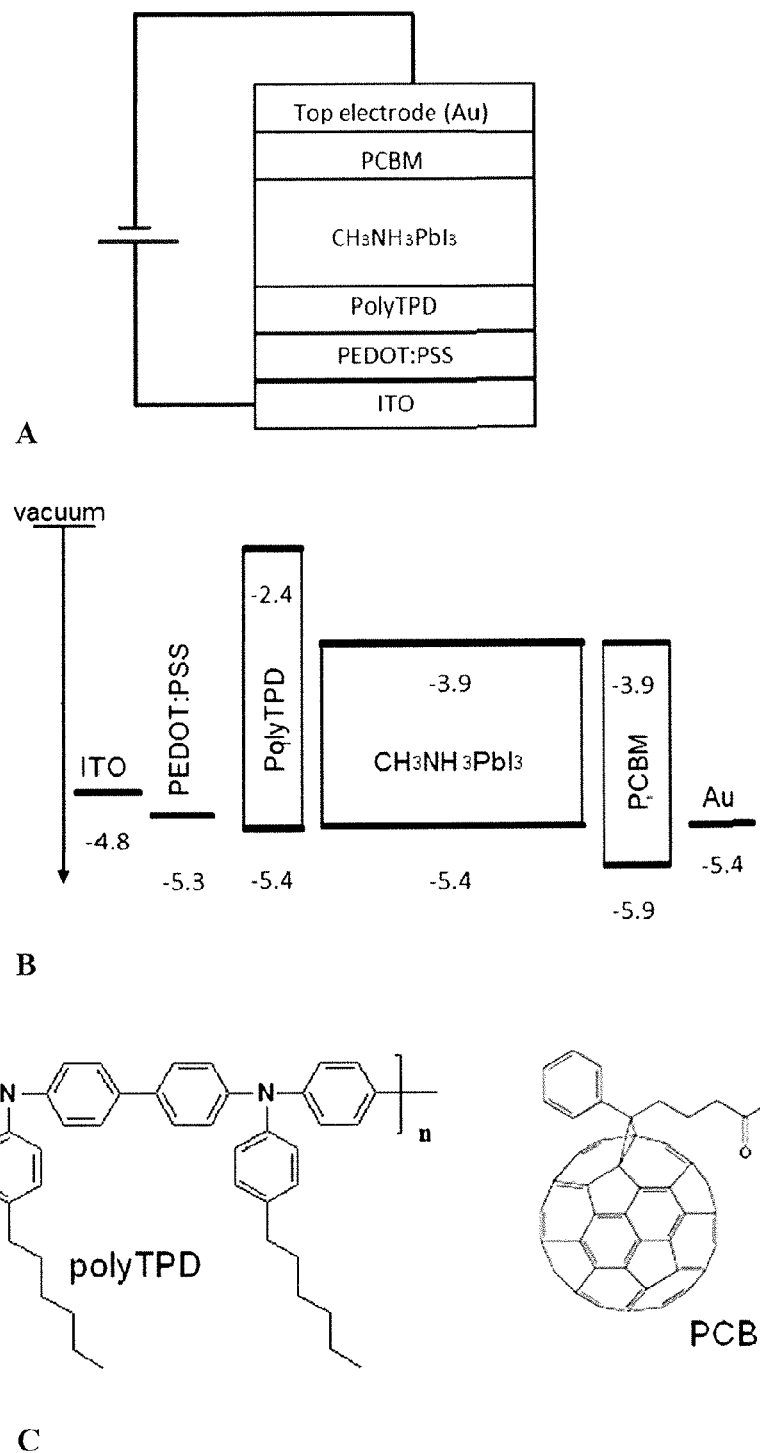
FIG. 2A shows the sketched configuration of the layout of an exemplified solid state solar cell of the invention.
FIG. 2B shows the schematic of the relative energy levels of each layer.
FIG. 2C shows the chemical structures of a polyarylamine derivative (polyTPD) and PCBM.

As in this work the $CH_3NH_3PbI_3$ layer is prepared via vacuum sublimation it can be easily implemented in different device architectures. To demonstrate that the $CH_3NH_3PbI_3$ is capable of performing most of the roles required to obtain an efficient solar cell and to minimize the use of costly organic semiconductors a simple device structure was chosen. In this structure which is typical for organic-photovoltaic and light-emitting devices a transparent conductor was used as the positive charge collecting contact. The structure of the device is shown in FIGS. 1A and 2A, and consists of a 70 nm poly(3,4-ethylenedioxy-thiophene):poly(styrenesulfonic acid) (PEDOT:PSS) layer and a thin layer ($\leq$10 nm) of poly[N,N'-bis(4-butylphenyl)-N,N'-bis(phenyl)benzidine] (polyTPD) (FIGS. 2A and B), as the electron blocking layer. On top of this the $CH_3NH_3PbI_3$ was thermally evaporated to a maximum thickness of 350 nm followed by a thin layer (<10 nm) of [6,6]-phenyl $C_{61}$-butyric acid methylester (PCBM) as the hole blocking layer. The device was completed by the evaporation of an Au top electrode (100 nm). The thickness of the layers was established using absorbance measurements. The relevant energy levels of the materials used to prepare the solar cell are depicted in FIG. 2B. The valence band (VB) and conduction band (CB) of the $CH_3NH_3PbI_3$ perovskite are −5.4 and −3.9 eV, versus vacuum respectively. Upon illuminating the device excitons are generated in the $CH_3NH_3PbI_3$ perovskite layer. It was reported that excitons in $CH_3NH_3PbI_3$ perovskites are of Wannier-Mott type implying that they may dissociate in the bulk of the perovskite layer. Due to the use of ITO/PEDOT:PSS as the hole collecting contact and Au as the electron collecting electrode the build-in voltage of this device is small. Hence, to direct the flow of electrons and holes, thin hole blocking and electron blocking layers are incorporated adjacent to the perovskite layer. PolyTPD and PCBM were selected for this role as their HOMO and LUMO levels, respectively, match well with the VB and CB of the perovskite, allowing for a good transport of holes towards the polyTPD and of electrons to the PCBM layer. As the LUMO of polyTPD is significantly closer to vacuum compared with the CB of the perovskite, polyTPD efficiently blocks the flow of electrons. The opposite process, the blocking of holes, occurs at the perovskite-PCBM interface due to the lower HOMO of PCBM compared with the VB of the perovskite. Whereas exciton dissociation may also occur at the perovskite-polyTPD and perovskite-PCBM interfaces it does not seem likely in our configuration due to low build-in voltage and the small difference in HOMO and LUMO levels between the perovskite and those of poly-TPD and PCBM, respectively.

Figure 4B:
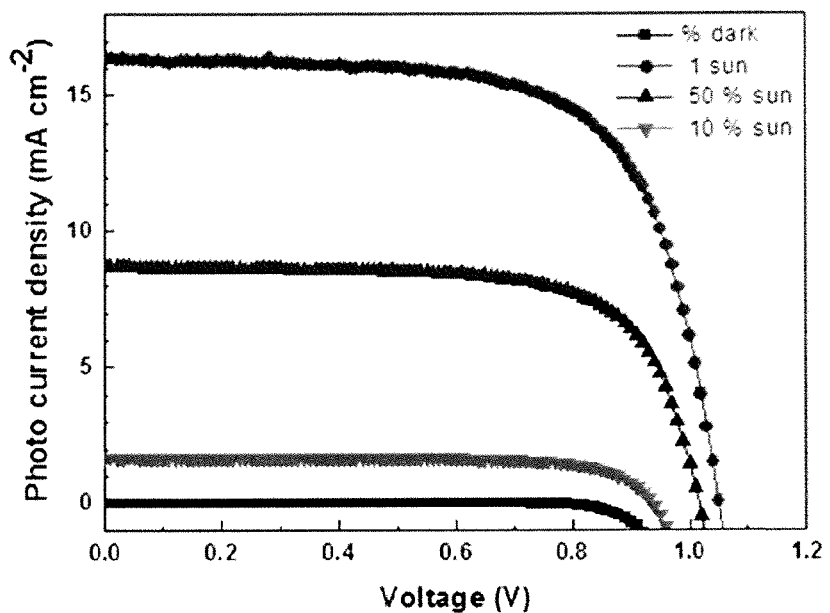
FIG. 4B shows Typical J-V shows J-V curves of a solar cell of the invention at 100 (dark circle—top curve), 50 (triangle—second curve from the top) and 10 mW cm$^{-2}$ (triangle—second curve from the bottom) and in the dark (square—bottom curve).
Figure 4C:
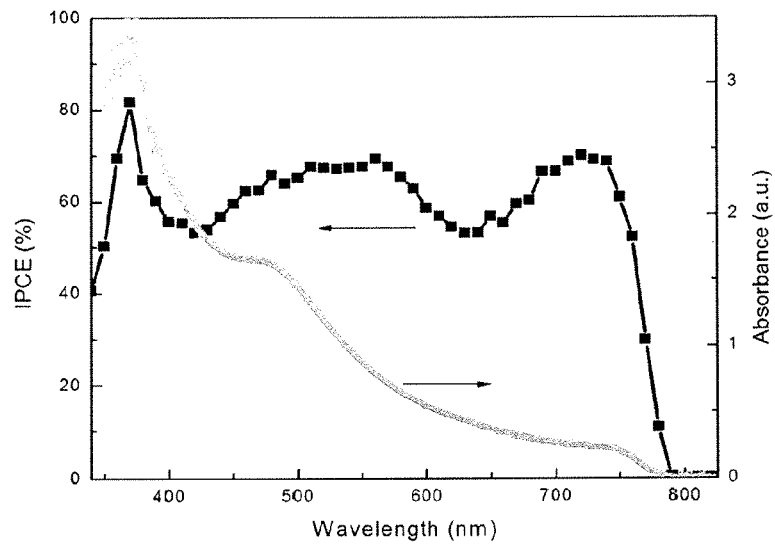
FIG. 4C shows IPCE spectrum (square) and absorbance (open circle) of a 350 nm thick perovskite layer.

FIG. 4B shows the current-voltage (J-V) characteristics of the perovskite solar cells measured in the dark, and under light intensities of 100, 50 and 10 mW cm-2. The short-circuit current density ($J_{SC}$), open-circuit voltage ($V_{OC}$) and fill factor (FF), respectively, are 16.37 mA cm$^{-2}$, 1.05 mV and 0.68, leading to power conversion efficiency of 12.3% measured at 100 mW cm$^{-2}$. The device at 50 and 10 mW cm$^{-2}$ exhibited slightly higher efficiencies, 12.5 and 12.4%, respectively, mostly due to an slight improvement in the fill factor. The high open circuit potential indicates that there are negligible surface and sub band-gap states in the perovskite film. The device performance under 100 mW cm$^{-2}$ is remarkable in view of the very thin perovskite film 350 nm.

The incident photon-to-current conversion efficiency (IPCE) spectra exhibit 68% (FIG. 4C) where the generation of photocurrent started at 790 nm in agreement with the band gap of the CH$_3$NH$_3$PbI$_3$. It is interesting to note that the IPCE spectra show a very steep onset, contrary to the IPCE spectra reported for TiO$_2$ and Al$_2$O$_3$ mesoscopic based perovskite cells. The IPCE spectrum is almost flat except for a dip at 630 nm, which could be due to the oxidized polyTPD, acting as a filter. Integrating the overlap of the IPCE spectrum with the AM1.5G solar photon flux yields a current density of 15.6 mA cm$^{-2}$, which is in excellent agreement with the measured photocurrent density 16.37 mA cm$^{-2}$ at the standard solar AM 1.5 intensity of 100 mW cm$^{-2}$ confirming that the mismatch between the simulated sunlight and the AM1.5G standard is negligible.

These excellent device performances obtained in an architecture with a very small build-in voltage are indicative that the excitons formed are not strongly bound. That is, the excitons dissociate into free electrons and holes in the bulk of the perovskite which are rapidly transported to the appropriate contacts due to the presence of the hole and electron blocking (rectifying) layers.

CONCLUSION

An efficient solid state thin film solar cell was obtained by sandwiching a sublimated CH$_3$NH$_3$PbI$_3$ perovskite layer in between two thin organic charge transporting layers that function as hole and electron blocker and contacting it via an ITO/PEDOT:PSS as the hole extraction and an Au electron extraction contact. The simple device architecture, which is n-type oxide and scaffold free, coupled with easy room temperature fabrication, high efficiency and reproducibility using economically favorable material rivals strongly with established thin film photovoltaic technologies. The device power conversion efficiency of 12.3% at 100 mW cm$^{-2}$ is remarkable in view of the very thin 350 nm perovskite film. The high short circuit current of 16.4 mA cm$^{-2}$ and the open circuit potential of 1.05 volt reveal that very few electrons and holes recombine demonstrating the effectiveness of the hole and electron blocking layer. The data obtained corroborate the hypothesis that the excitons dissociate in the bulk of the material rather than at the interface with the hole and electron blocking layer. This new class of perovskite solar cell, which is neither "Dye-Sensitized" nor "Mesoscopic" will find wide spread applications to competitor thin film-based photovoltaic solar cells.

The invention claimed is:
1. A method for producing a solid state perovskite solar cell, the method comprising the steps of:
   providing a hole collector layer on a side of the solid state solar cell exposed to light, which forms a positive pole on a transparent front contact on the side of the solid state solar cell exposed to light;
   applying a conductive layer onto the hole collector layer;
   applying an electron blocking layer onto the conductive layer;
   applying a sensitizer layer onto the electron blocking layer;
   applying a single hole blocking layer onto the sensitizer layer; and
   providing a current collector and/or a metal layer or a conductor which forms a negative pole on a dark side of the solid state solar cell,
   wherein the sensitizer layer having a homogenous surface and a thickness from 250 nm to 800 nm and consists of a sublimated and condensed three-dimensional organic-inorganic perovskite and is applied by one or more methods selected from physical vapor deposition methods group consisting of deposition by sublimation process, cathodic arc deposition, electron beam physical vapor deposition, thermal evaporation, evaporative deposition, pulse laser deposition, sputter deposition or from chemical vapor deposition; and
   wherein the single hole blocking layer comprises a material having a LUMO level matching with the conduction band of the organic-inorganic perovskite and being selected from [6,6]-Phenyl-C$_{61}$-butyric acid methyl ester (PCBM), 1,4,5,8,9,11-hexazatriphenylene-hexacarbonitrile (HAT-CN), (C$_{60}$-I$_h$)[5,6]fullerene (C60), (C70-D5h)[5,6]fullerene (C70), [6,6]-Phenyl C$_{71}$ butyric acid methyl ester (PC70BM), and metal oxides;
   the electron blocking layer comprises a material having a HOMO level matching with the valence band of the organic-inorganic perovskite and being selected from aromatic amine derivatives being selected from triphenylamine, carbazole, N,N,(diphenyl)-N',N'di-(alkylphenyl)-4,4'-biphenyldiamine, (pTPDs), diphenylhydrazone, poly [N,N'-bis(4-butylphenyl)-N,N'-bis (phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD); and
   the conductive layer comprises one or more conductive materials selected from poly(3,4-ethylenedioxythiophene):poly(styrenesulfonate) (PEDOT:PSS), poly(3,4-ethylenedioxythiophene):poly(styrenesulfonate):graphene nanocomposite (PEDOT:PSS:graphene), poly (N-vinylcarbazole) (PVK) and sulfonated poly (diphenylamine) (SPDPA).

2. The method of claim 1, wherein the step of applying the sensitizer layer is performed at a vacuum of from 10$^{-2}$ to 10$^{-10}$ mbar.

3. The method of claim 1, wherein the step of applying the sensitizer layer is performed by deposition by sublimation process, wherein the sensitizer layer comprising an organic-inorganic perovskite is obtained by co-deposition of one or more sublimated divalent metal salts or sublimated trivalent metal salts and of one or more Response to Non-Final Office Action sublimated organic ammonium salts.

4. The method of claim 3, wherein the divalent metal salts are of formula MX$_2$ and the trivalent metal salts are of formula NX$_3$; wherein
   M is a divalent metal cation selected from the group consisting of Cu$^{2+}$, Ni$^{2+}$, Co$^{2+}$, Fe$^{2+}$, Mn$^{2+}$, Cr$^{2+}$, Pd$^{2+}$, Cd$^{2+}$, Ge$^{2+}$, Sn$^{2+}$, Pb$^{2+}$, Eu$^{2+}$, or Yb$^{2+}$;
   N is selected from the group of Bi$^{3+}$ and Sb$^{3+}$; and
   X is independently selected from Cl$^-$, Br$^-$, I$^-$, NCS$^-$, CN$^-$, and NCO$^-$;
   and wherein the organic ammonium salts is selected from AX, AA' X$_2$, and BX$_2$; wherein
   A and A' are independently selected from organic, monovalent cations selected from primary, secondary, tertiary or quaternary organic ammonium compounds, including N-containing heterorings and ring systems, A and A' having from 1 to 60 carbons and 1 to 20 heteroatoms;
   B is an organic, bivalent cation selected from primary, secondary, tertiary or quaternary organic ammonium compounds having from 1 to 60 carbons and 2 to 20 heteroatoms and having two positively charged nitrogen atoms; and X is independently selected from Cl⁻, Br⁻, I⁻, NCS⁻, CN⁻, and NCO⁻.

5. The method of claim 1, wherein the step of applying the sensitizer layer comprises heating the one or more divalent or trivalent salts and the ammonium salts up to their respective sublimation temperature to obtain a vapor of each salt;

depositing said vapors onto the preceding layer; and forming the organic-inorganic perovskite.

6. A solid state perovskite solar cell comprising a hole collector layer, a conductive layer, an electron blocking layer, a sensitizer layer, a single hole blocking layer and a current collector layer, wherein:

the hole collector layer is on a side of the solid state solar cell exposed to light, which forms a positive pole on a transparent front contact on the side of the solid state solar cell exposed to light, and is under the conductive layer;

the electron blocking layer is under the sensitizer layer is between the conductive layer and the sensitizer layer being under the single hole blocking layer, which is in contact with the current collector layer being a metal or a conductor which forms a negative pole on a dark side of the solid state solar cell;

the sensitizer layer having a homogenous surface and a thickness from 250 nm to 800 nm and consists of a sublimated and condensed three-dimensional organic-inorganic perovskite, said sublimated and condensed three-dimensional organic-inorganic perovskite being provided by one or more methods selected from physical vapor deposition methods group consisting of deposition by sublimation process, cathodic arc deposition, electron beam physical vapor deposition, thermal evaporation, evaporative deposition, pulse laser deposition, sputter deposition or from chemical vapor deposition;

the single hole blocking layer comprises one or more materials having a LUMO level matching with the conduction band of the organic-inorganic perovskite and being selected from [6,6]-phenyl-$C_{61}$-butyric acid methyl ester (PCBM), 1,4,5,8,9,11-hexazatriphenylene-hexacarbonitrile (HAT-CN), $(C_{60}$-$I_h)[5,6]$ fullerene (C60), (C70-D5h)[5,6]fullerene (C70), [6,6]-Phenyl $C_{71}$ butyric acid methyl ester (PC70BM), and metal oxides;

the electron blocking layer comprises one or more materials having a HOMO level matching with the valence band of the organic-inorganic perovskite and being selected from aromatic amine derivatives being selected from triphenylamine, carbazole, N,N,(diphenyl)-N',N'di-(alkylphenyl)-4,4'-biphenyldiamine, (pT-PDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD); and the conductive layer comprises one or more conductive materials selected from poly(3,4-ethylenedioxythiophene):poly(styrenesulfonate) (PEDOT:PSS), poly(3,4-ethylenedioxythiophene):poly(styrenesulfonate): grapheme nanocomposite (PEDOT:PSS:graphene), poly(N-vinylcarbazole) (PVK) and sulfonated poly(diphenylamine) (SPDPA).

7. The solid state perovskite solar cell of claim 6, wherein the single hole blocking layer has a thickness of ≤10 nm.

8. The solid state perovskite solar cell of claim 6, wherein the hole collector comprises a conducting layer being selected from conducting glass or conducting plastic and a conducting material being selected from indium doped thin oxide (ITO), fluorine doped tin oxide (FTO), ZnO—$Ga_2O_3$, ZnO—$Al_2O_3$, tin-oxide, antimony doped tin oxide (ATO), $SrGeO_3$ and zinc oxide.

9. The solid state perovskite solar cell of claim 6, wherein the sublimated and condensed three-dimensional organic-inorganic perovskite is composed of one or more sublimated divalent metal salts or one or more sublimated trivalent metal salts and one or more sublimated organic ammonium salts, said one or more sublimated divalent metal salts or sublimated trivalent metal salts being condensed with said one or more sublimated organic ammonium salts.

10. The solid state perovskite solar cell of claim 9, wherein the divalent metal salts are of formula $MX_2$ and the trivalent metal salts are of formula $NX_3$; wherein M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$;

N is selected from the group of $Bi^{3+}$ and $Sb^{3+}$; and

X is independently selected from Cl⁻, Br⁻, I⁻, NCS⁻, CN⁻, and NCO⁻;

and wherein the organic ammonium salts is selected from AX, AA' $X_2$, and $BX_2$; wherein A and A' are independently selected from organic, monovalent cations selected from primary, secondary, tertiary or quaternary organic ammonium compounds, including N-containing heterorings and ring systems, A and A' having from 1 to 60 carbons and 1 to 20 heteroatoms;

B is an organic, bivalent cation selected from primary, secondary, tertiary or quaternary organic ammonium compounds having from 1 to 60 carbons and 2 to 20 heteroatoms and having two positively charged nitrogen atoms; and X is independently selected from Cl⁻, Br⁻, I⁻, NCS⁻, CN⁻, and NCO⁻.

11. The solid state perovskite solar cell of claim 6, wherein the sublimated and condensed three-dimensional organic-inorganic perovskite comprises a perovskite-structure of any one of formulae (I), (II), (III), (IV), (V) and/or (VI) below:

| | |
|---|---|
| AA'MX₄ | (I) |
| AMX₃ | (II) |
| AA'N$_{2/3}$X₄ | (III) |
| AN$_{2/3}$X₃ | (IV) |
| BN$_{2/3}$X₄ | (V) |
| BMX₄ | (VI) | wherein,

A and A' are independently selected from organic, monovalent cations selected from primary, secondary, tertiary or quaternary organic ammonium compounds, including N-containing heterorings and ring systems, A and A' having independently from 1 to 60 carbons and 1 to 20 heteroatoms;

B is an organic, bivalent cation selected from primary, secondary, tertiary or quaternary organic ammonium compounds having from 1 to 60 carbons and 2-20 heteroatoms and having two positively charged nitrogen atoms;

M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$;

N is selected from the group of $Bi^{3+}$ and $Sb^{3+}$; and,

X are independently selected from $Cl^-$, $Br^-$, $I^-$, $NCS^-$, $CN^-$, and $NCO^-$.

* * * * *

UNITED STATES PATENT AND TRADEMARK OFFICE
CERTIFICATE OF CORRECTION

PATENT NO. : 10,665,800 B2
APPLICATION NO. : 14/917852
DATED : May 26, 2020
INVENTOR(S) : Mohammad Khaja Nazeeruddin et al.

Page 1 of 1

It is certified that error appears in the above-identified patent and that said Letters Patent is hereby corrected as shown below:

On the Title Page

Item [71] and [73]
Delete "Ecole Polytechnique Federate de Lausanne (EPFL)" and insert --Ecole Polytechnique Federale de Lausanne (EPFL)--

In the Specification

Column 22
Lines 27 and 28: delete "... efficiency (PCE) of 4%, preferably 5%, more preferably 6%, and most preferably 7%, ..." and insert --... efficiency (PCE) of $\geq$ 4%, preferably $\geq$ 5%, more preferably $\geq$ 6%, and most preferably $\geq$ 7%, ...--

In the Claims

Column 26
Claim 3, Line 47: delete "... metal salts and of one or more Response to Non-Final Office Action sublimated organic ammonium salts ..." and insert --... metal salts and of one or more sublimated organic ammonium salts ...--

Signed and Sealed this
Twenty-first Day of July, 2020

Andrei Iancu
*Director of the United States Patent and Trademark Office*